(12) United States Patent
Zheng et al.

(10) Patent No.: US 12,191,360 B2
(45) Date of Patent: Jan. 7, 2025

(54) METHODS FOR SILICON CARBIDE GATE FORMATION

(71) Applicant: Applied Materials, Inc., Santa Clara, CA (US)

(72) Inventors: Yi Zheng, Sunnyvale, CA (US); Er-Xuan Ping, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 568 days.

(21) Appl. No.: 17/562,938

(22) Filed: Dec. 27, 2021

(65) Prior Publication Data

US 2023/0207638 A1    Jun. 29, 2023

(51) Int. Cl.
*H01L 29/40* (2006.01)
*H01L 21/04* (2006.01)
*H01L 29/16* (2006.01)
*H01L 29/423* (2006.01)

(52) U.S. Cl.
CPC .......... *H01L 29/401* (2013.01); *H01L 21/049* (2013.01); *H01L 29/1608* (2013.01); *H01L 29/4236* (2013.01)

(58) Field of Classification Search
CPC . H01L 21/049; H01L 29/401; H01L 29/1608; H01L 29/4236; H01L 29/513; H01L 29/66068
USPC ....................................................... 438/589
See application file for complete search history.

(56) References Cited

U.S. PATENT DOCUMENTS

| 8,536,656 B2 | 9/2013 | Ramachandran et al. |
| 9,590,069 B2 | 3/2017 | Dasgupta et al. |
| 10,297,610 B2 | 5/2019 | Kai et al. |
| 2017/0309484 A1* | 10/2017 | Draghici ............ H01L 21/0455 |
| 2023/0197465 A1* | 6/2023 | Marchegiani ..... H01L 21/31144 438/714 |

OTHER PUBLICATIONS

N. A. Mahadik et al., Post-Growth Reduction of Basal Plane Dislocations by High Temperature Annealing in 4H—SiC Epilayers, Feb. 26, 2014, Materials Science Forum ISSN: 1662-9752, vols. 778-780, pp. 324-327, © 2014 Trans Tech Publications Ltd, Switzerland.

* cited by examiner

*Primary Examiner* — Fazli Erdem
(74) *Attorney, Agent, or Firm* — MOSER TABOA (57) ABSTRACT

A method of forming a gate structure on a substrate with increased charge mobility. In some embodiments, the method may include depositing an amorphous carbon layer on a silicon carbide layer on the substrate to form a capping layer on the silicon carbide layer, annealing the silicon carbide layer at a temperature of greater than approximately 1800 degrees Celsius, forming a hard mask on the silicon carbide layer by patterning the amorphous carbon layer, etching a trench structure of the gate structure into the silicon carbide layer using the hard mask, removing the hard mask to expose the silicon carbide layer, depositing a silicon dioxide layer on the silicon carbide layer using an ALD process, performing at least one interface treatment on the silicon dioxide layer, depositing a gate oxide layer of the gate structure on the silicon dioxide layer, and depositing a gate material on the gate oxide layer.

20 Claims, 8 Drawing Sheets

METHODS FOR SILICON CARBIDE GATE FORMATION

FIELD

Embodiments of the present principles generally relate to semiconductor processing of semiconductor substrates.

BACKGROUND

Silicon power devices have improved significantly over the past several decades, but these devices are now approaching performance limits imposed by the fundamental material properties of silicon, and further progress can only be made by migrating to more robust semiconductor. Silicon carbide (SiC) is a wide bandgap semiconductor with superior physical and electrical properties that can serve as the basis for the high-voltage, low-loss power electronics of the future. SiC is a IV-IV compound semiconductor with a bandgap of 2.3-3.3 eV (depending on the crystal structure, or polytype). SiC exhibits about 10 times breakdown electric field strength and 3 times higher thermal conductivity than silicon, making SiC especially attractive for high-power and high-temperature devices. For example, the on-state resistance of SiC power devices is orders of magnitude lower than that of silicon devices at a given blocking voltage, leading to much higher efficiency in electric power conversion.

However, the inventors have observed that the performance of MOSFETs is nevertheless limited by the quality of SiC/silicon dioxide ($SiO_2$) interfaces, the interface state density (DIT) at $SiC/SiO_2$ interfaces near the conduction band edge (Ec) of SiC ($10^{12}$-$10^{13}$ $eV^{-1}$ $cm^{-2}$) is at least two orders of magnitude higher than that of typical $Si/SiO_2$ systems (~$10^{10}$ $eV^{-1}$ $cm^{-2}$). A significant portion of electrons at the inversion layer of MOSFETs are thereby trapped by the interface states, resulting in low effective channel mobility.

Accordingly, the inventors have provided improved processes that enhance channel mobility in silicon-carbide based MOSFET, substantially increasing SiC transistor performance.

SUMMARY

Methods for forming silicon-carbide gate structures are provided herein.

In some embodiments, a method of forming a gate structure on a substrate may comprise depositing an amorphous carbon layer on a silicon carbide layer of the gate structure on the substrate to form a capping layer on the silicon carbide layer, annealing the silicon carbide layer at a temperature of greater than approximately 1800 degrees Celsius, forming a hard mask on the silicon carbide layer by patterning the amorphous carbon layer, etching a trench structure of the gate structure into the silicon carbide layer using the hard mask, removing the hard mask to expose the silicon carbide layer, depositing a silicon dioxide layer of the gate structure on the silicon carbide layer using an atomic layer deposition process, performing at least one interface treatment on the silicon dioxide layer, depositing a gate oxide layer of the gate structure on the silicon dioxide layer, and depositing a gate material of the gate structure on the gate oxide layer.

In some embodiments, the method may further comprise annealing the silicon carbide layer at a temperature of greater than approximately 2000 degrees Celsius, etching the trench structure into the silicon carbide layer using a selective etch process with a higher etch rate of silicon carbide than amorphous carbon, annealing the silicon carbide layer after depositing the amorphous carbon layer to diffuse dopants into the silicon carbide layer, annealing the silicon carbide layer after depositing the amorphous carbon layer to remove defects in the silicon carbide layer, patterning the amorphous carbon layer by spin coating a photoresist layer on the amorphous carbon layer, exposing the photoresist layer to a light source, and removing areas of the amorphous carbon layer where at least one trench structure is to be formed, depositing the silicon dioxide layer on the silicon carbide layer using the atomic layer deposition process at a temperature of approximately 100 degrees Celsius to approximately 600 degrees Celsius, depositing the silicon dioxide layer on the silicon carbide layer using the atomic layer deposition process to a thickness of approximately 1 nm to approximately 100 nm, depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino) silane (BDEAS), trisilylamine (TSA), or diisopropylamino silane (DIPAS), and/or performing at least one interface treatment on the silicon dioxide layer including high temperature, oxygen/nitrogen radical treatment, or an additional oxide deposition.

In some embodiments, a method of forming a gate structure on a substrate may comprise depositing an amorphous carbon layer on a silicon carbide layer of the gate structure on the substrate to form a capping layer on the silicon carbide layer, annealing the silicon carbide layer at a temperature of greater than approximately 1800 degrees Celsius, forming a hard mask on the silicon carbide layer by patterning the amorphous carbon layer with a photoresist layer, selectively etching a trench structure of the gate structure into the silicon carbide layer using the hard mask with an etch process having a higher etch rate of silicon carbide over amorphous carbon, removing the hard mask to expose the silicon carbide layer, depositing a silicon dioxide layer of the gate structure on the silicon carbide layer using an atomic layer deposition process at a process temperature of approximately 100 degrees Celsius to approximately 600 degrees Celsius, performing at least one interface treatment on the silicon dioxide layer including high temperature, oxygen/nitrogen radical treatment, or an additional oxide deposition, depositing a gate oxide layer of the gate structure on the silicon dioxide layer, and depositing a gate material of the gate structure on the gate oxide layer.

In some embodiments, the method may further comprise annealing the silicon carbide layer at a temperature of greater than approximately 2000 degrees Celsius, annealing the silicon carbide layer after depositing the amorphous carbon layer to diffuse dopants into the silicon carbide layer, annealing the silicon carbide layer after depositing the amorphous carbon layer to remove defects in the silicon carbide layer, depositing the silicon dioxide layer on the silicon carbide layer using the atomic layer deposition process to a thickness of approximately 1 nm to approximately 100 nm, and/or depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino) silane (BDEAS), trisilylamine (TSA), or diisopropylamino silane (DIPAS).

In some embodiments, a non-transitory, computer readable medium having instructions stored thereon that, when executed, cause a method for forming a gate structure on a substrate to be performed, the method may comprise depositing an amorphous carbon layer on a silicon carbide layer of the gate structure on the substrate to form a capping layer on the silicon carbide layer, annealing the silicon carbide layer at a temperature of greater than approximately 1800 degrees Celsius, forming a hard mask on the silicon carbide layer by patterning the amorphous carbon layer, etching a trench structure of the gate structure into the silicon carbide layer using the hard mask, removing the hard mask to expose the silicon carbide layer, depositing a silicon dioxide layer of the gate structure on the silicon carbide layer using an atomic layer deposition process, performing at least one interface treatment on the silicon dioxide layer, depositing a gate oxide layer of the gate structure on the silicon dioxide layer, and depositing a gate material of the gate structure on the gate oxide layer.

In some embodiments, method on the computer readable medium may further comprise annealing the silicon carbide layer at a temperature of greater than approximately 2000 degrees Celsius, depositing the silicon dioxide layer on the silicon carbide layer using the atomic layer deposition process at a temperature of approximately 100 degrees Celsius to approximately 600 degrees Celsius, depositing the silicon dioxide layer on the silicon carbide layer using the atomic layer deposition process to a thickness of approximately 1 nm to approximately 100 nm, depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino)silane (BDEAS), trisilylamine (TSA), or diisopropylamino silane (DIPAS), and/or performing at least one interface treatment on the silicon dioxide layer including high temperature, oxygen/nitrogen radical treatment, or an additional oxide deposition.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide increased channel mobility to enhance performance of silicon-carbide (SiC) gate structures. An atomic deposition layer (ALD) is used to deposit a gate dielectric liner to reduce interface state density (DIT) on the silicon-carbide interface yielding a higher quality silicon-carbide to gate dielectric interface. In some embodiments, a high temperature anneal of greater than approximately 1800 degrees Celsius is used for superior yields in dopant activation and for reduction of defects in the silicon-carbide material. The high temperature anneal further enhances the performance of the silicon-carbide gate structures. The methods of the present principles also provide improved process integration with amorphous carbon film as a capping layer for dopant activation/silicon carbide defect removal and as a hard mask for gate patterning processes.

Silicon-carbide channel mobility degradation is an industry-wide problem. Carbon cluster formation at the silicon-carbide to gate dielectric interface has been observed by the inventors as a root cause of the degradation. Techniques that have been previously attempted to improve the interface without success include nitridation of the interface, formation of gate dielectric material from high-k dielectrics, formation of gate dielectric material from radicalized oxygen silicon dioxide ($SiO_2$) from remote plasma sources, and formation of gate dielectric material from polysilicon deposition plus oxidation. The methods of the present principles substantially reduce carbon clusters from the interface by using an ALD $SiO_2$ deposition process at a low temperature (approximately 100 degrees Celsius to 600 degrees Celsius) to form a gate dielectric liner with low interface state density (DIT) on the underlying SiC material. The gate dielectric liner is formed with lower temperature $SiO_2$ to prevent carbon cluster formation by minimizing disturbance (minimal chemical bond rearranging) of the underlying SiC material. A gate dielectric layer is then formed on the gate dielectric liner using a high temperature process to form high quality $SiO_2$ prior to deposition of the gate material. With the present techniques, carbon cluster formation is dramatically reduced, yielding high channel mobility with increased performance of the SiC-based transistor.

The reliability of SiC power devices using conventional oxidation approaches is not ideal due to the interface quality between the underlying SiC layer and the gate dielectric. The processes of the present principles (e.g., ALD SiO+ treatment, etc.) can improve the reliability substantially. Reliability is critical to parameters of power device applications such as high temperature gate bias (HTGB), high temperature reverse bias (HTRB), high temperature gate stress (HTGS), time-dependent gate oxide breakdown (TDDB), thermal conductivity and diffusivity (THB100), thermal shock (TS), intermittent operating life (IOL), and electrostatic discharge (ESD), and the like. The processes of the present principles are not only applicable to SiC devices. The processes also work for any trench gate MOSFET in various semiconductor materials including Si. The methods of the present principles solve a key problem of gate oxide growth sensitivity to different crystalline orientation at trench side wall versus trench bottom, improving crystalline (Si or SiC) facet oxidation non-uniformity. Conventional approaches increase the overall thickness of the gate oxide to avoid the sensitivity effect but causes a non-uniform e-field around any thinner oxide areas.

For the sake of brevity, doping examples are depicted as P-type dopants but are not meant to be limiting. N-type and combinations of N-type and P-type dopants may be used during the methods of the present principles. In addition, a vertical trench gate structure is used as an example and is also not meant to be limiting. The processes of the present principles may also be used for planar gate structures (see FIG. 3 and method 300 below) and the like as the layers discussed below may be formed, treated, and processed without an opening formed into the silicon carbide layer.

Figure 1:
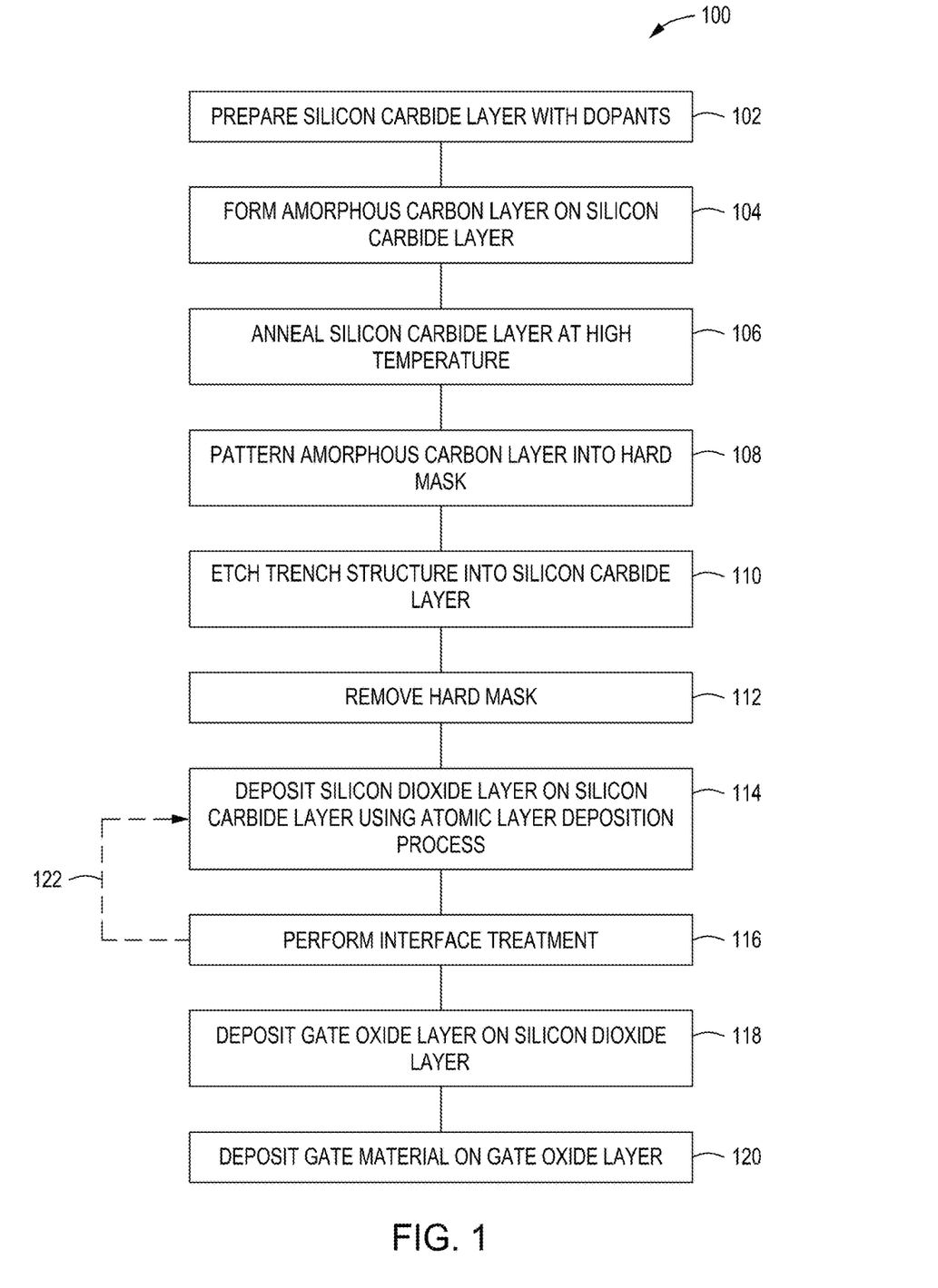
FIG. 1 is a method of forming a trench gate structure in a silicon carbide layer on a substrate in accordance with some embodiments of the present principles.

FIG. 1 is a method 100 of forming a vertical gate structure in a silicon carbide layer on a substrate in accordance with some embodiments. FIGS. 2A-2I may be referenced during the method 100 discussion. In block 102, a substrate with a silicon carbide layer 202 has been prepared previously (deposition/formation of silicon carbide layer 202 and doping, etc.) and may contain dopants 206 diffused into the silicon carbide layer 202 according to a specific gate structure type (P-type/N-type, etc.) as depicted in a view 200A of FIG. 2A. The silicon carbide layer 202 may also contain defects 208 such as basal plane dislocations (SiC crystal growth defects) and other types of defects (dopant implant defects, etc.) that form during growth of the silicon carbide layer 202. In block 104, an amorphous carbon layer 204 is formed on the silicon carbide layer 202 as depicted in a view 200A of FIG. 2A. The amorphous carbon layer 204 functions initially as a capping layer for a subsequent annealing process. The amorphous carbon layer 204 is low in hydrogen as compared to traditional capping layers. Traditional capping layers such as carbonized photoresists with carbon hydrogen polymers are limited to less than 1700 degrees Celsius due to the high hydrogen content causing shrinkage of the capping layer. The capping layer prevents sublimation of silicon atoms from the silicon carbide layer 202 under high anneal temperatures.

Figure 2A:
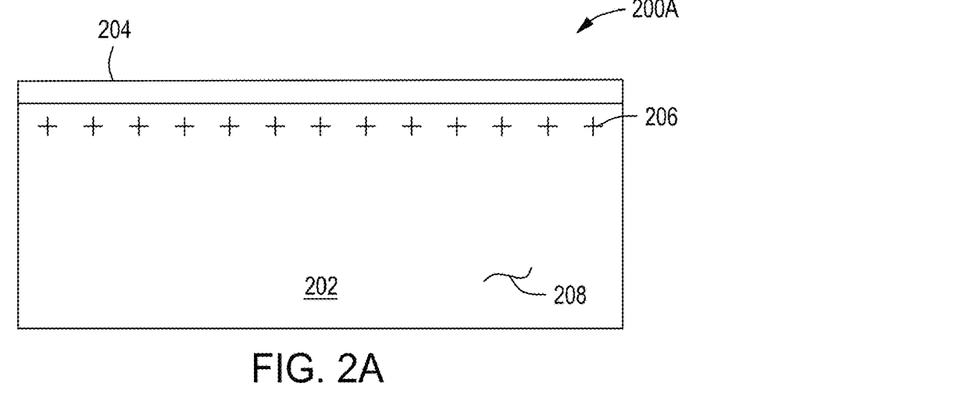
FIG. 2A depicts a cross-sectional view of an amorphous carbon layer deposited on a silicon carbide layer with doping in accordance with some embodiments of the present principles.
Figure 2B:
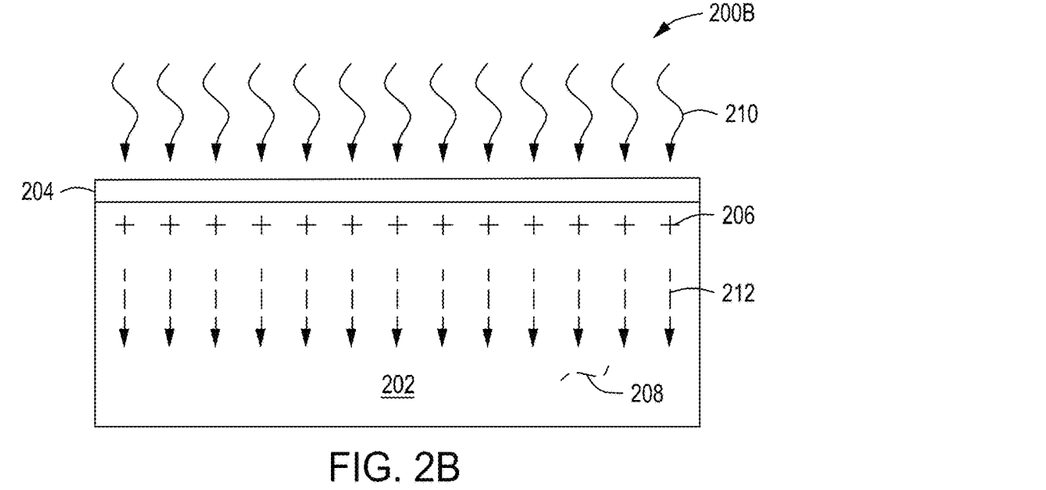
FIG. 2B depicts a cross-sectional view of a silicon carbide layer being annealed in accordance with some embodiments of the present principles.
Figure 2C:
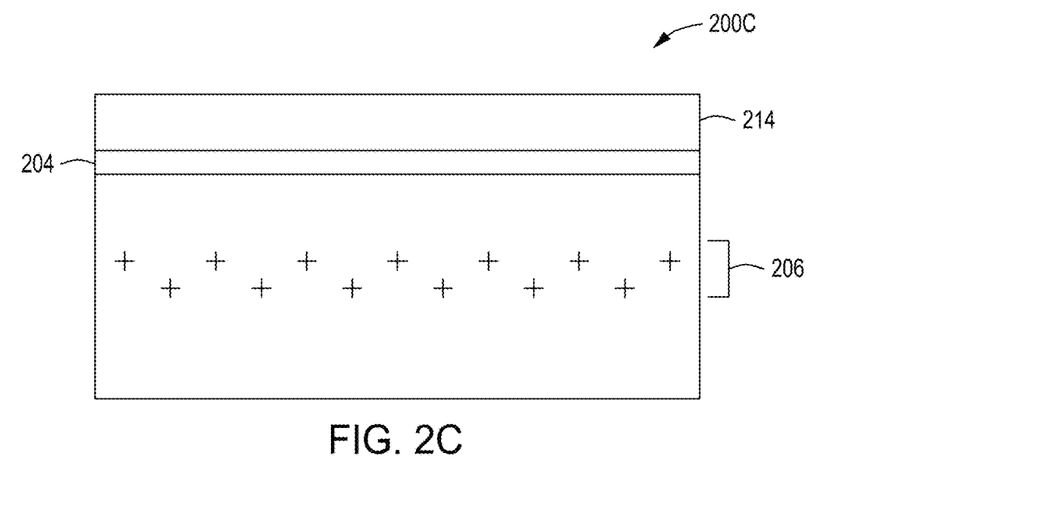
FIG. 2C depicts a cross-sectional view of a photoresist layer on an amorphous carbon layer on a silicon carbide layer in accordance with some embodiments of the present principles.
Figure 2D:
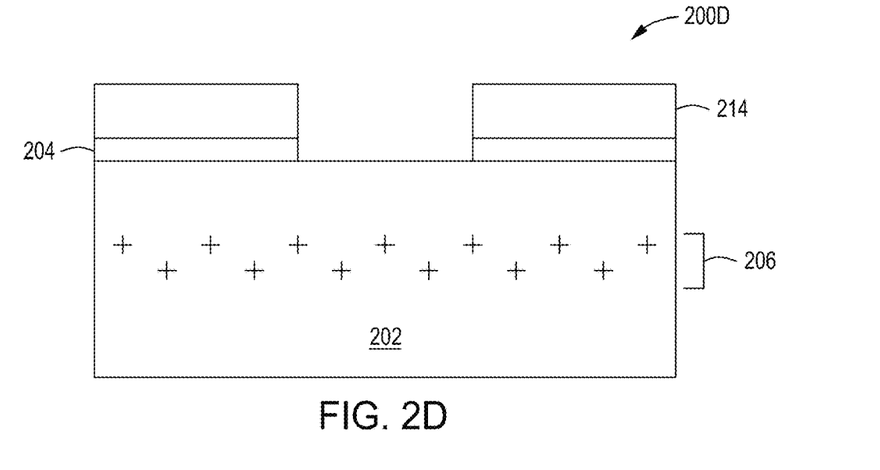
FIG. 2D depicts a hard mask patterning of an amorphous carbon layer on a silicon carbide layer in accordance with some embodiments of the present principles.

In block 106, the silicon carbide layer 202 is annealed 210 at high temperatures as depicted in a view 200B of FIG. 2B. In some embodiments, the annealing temperature may be greater than approximately 1800 degrees Celsius. In some embodiments, the annealing temperature may be greater than approximately 2000 degrees Celsius. The amorphous carbon layer 204 can withstand extremely high temperatures and prevents sublimation of the silicon atoms during the annealing process. The extremely high temperatures of the annealing process 212 drive the dopants 206 further into the silicon carbide layer 202 (activates the dopants 206) and may also eliminate or reduce the defects 208 (dashed line) in the silicon carbide layer 202. The annealing process may be performed on many substrates at a time in a batch process in a furnace and the like. In block 108, the amorphous carbon layer 204 is patterned into a hard mask. In a view 200C of FIG. 2C, the amorphous carbon layer 204 is, for example, spin coated with a photoresist layer 214 which is then patterned and used to remove portions of the amorphous carbon layer 204 using a first etch chemistry to form a hard mask from the amorphous carbon layer 204. An oxygen plasma etch process may be used to remove the portions of the amorphous carbon layer 204. The amorphous carbon layer 204 functions initially as a capping layer in the method 100 and is then used as a hard mask in etching processes for forming openings such as trenches and the like in the silicon carbide layer 202. After formation of the hard mask, the photoresist layer 214 is removed.

Figure 2E:
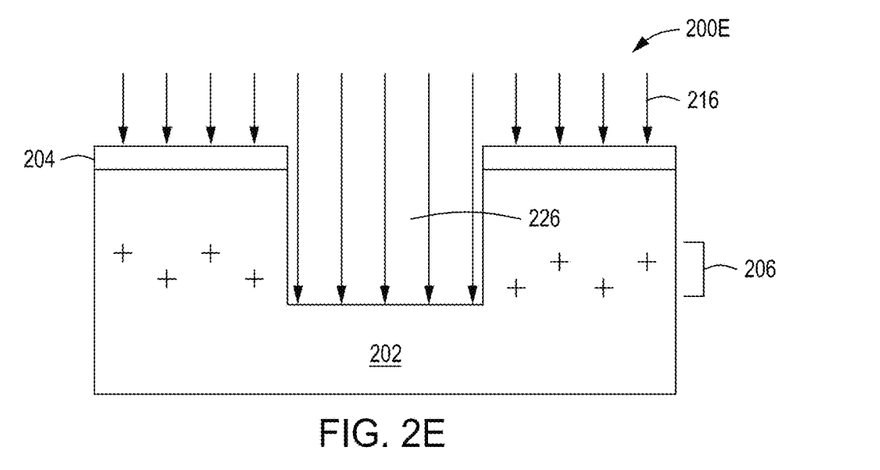
FIG. 2E depicts a trench structure etched into a silicon carbide layer in accordance with some embodiments of the present principles.

In block 110, for example, a trench structure 226 is formed in the silicon carbide layer 202 using the hard mask (patterned amorphous carbon layer) and a second etch chemistry as depicted in a view 200E of FIG. 2E. A selective etching process 216 is used where the etchant has greater selectivity (etching rate) of silicon carbide material of the silicon carbide layer over amorphous carbon material of the hard mask. In block 112, after the etching process is completed, the hard mask (patterned amorphous carbon layer) is removed by ashing processes and the like to expose the underlying silicon carbide layer 202. In block 114, a silicon dioxide layer 218 is deposited on the silicon carbide layer 202 using an atomic layer deposition (ALD) process as depicted in a view 200F of FIG. 2F. In some embodiments, the silicon dioxide layer 218 is deposited in the trench structure 226 and also on a field surface 228 of the silicon carbide layer 202. The silicon dioxide layer 218 is conformal to surfaces 230 of the trench structure. In some embodiments, the silicon dioxide layer 218 is deposited using low temperatures of approximately 100 degrees Celsius to approximately 600 degrees Celsius. In some embodiments, the silicon dioxide layer 218 is deposited using a low temperature of approximately 200 degrees Celsius or less. The low temperatures allow for formation of the silicon dioxide layer 218 on the silicon carbide layer 202 without disrupting the interface 232 between the silicon dioxide layer 218 and the silicon carbide layer 202, preserving the silicon and carbon atomic structures in the silicon carbide layer 202 to increase charge mobility. The low temperature silicon dioxide deposition process prevents carbon clustering at the interface 232 to substantially increase charge mobility. The silicon dioxide layer 218 acts as a gate dielectric liner for the subsequently deposited gate dielectric.

Figure 2F:
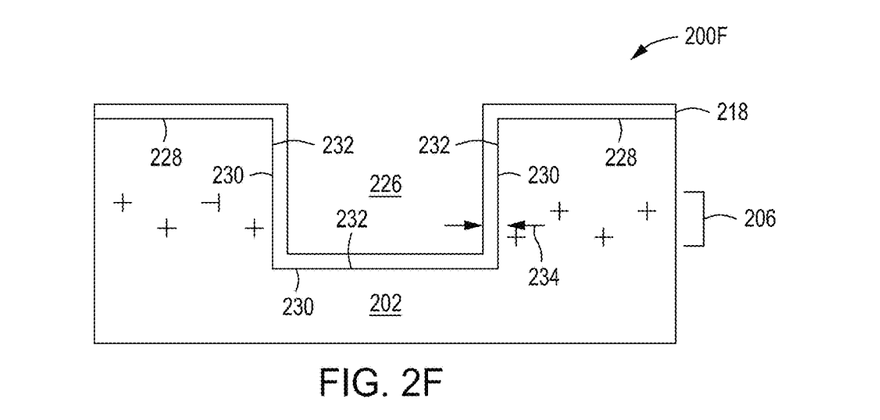
FIG. 2F depicts a silicon dioxide layer deposited on a trench structure in the silicon carbide layer in accordance with some embodiments of the present principles.

In some embodiments, the silicon dioxide deposition process is performed in an ALD chamber using gas precursors, such as but not limited to, $SiCl_4$, $NH_3$ and $H_2O$, bis(t-butylamino) silane (BTAS), bis(diethylamino) silane (BDEAS), and/or trisilylamine (TSA), diisopropylamino silane (DIPAS), etc. In some embodiments, the silicon dioxide layer 218 may be deposited to a thickness 234 of approximately 5 nm to approximately 10 nm. Pressure during the deposition process may be in the millitorr range to the torr range. The pressure is sufficient to enable physical absorption for ALD processes. The quality of the low-temperature silicon dioxide deposition is generally too low to function as the gate dielectric of a gate due to many defects in the silicon dioxide caused by the low temperature oxide deposition. The silicon dioxide layer 218 functions as an interface between the silicon carbide layer 202 and a subsequently deposited gate dielectric layer to preserve the silicon-carbon atomic structures in the silicon carbide layer 202.

Figure 2G:
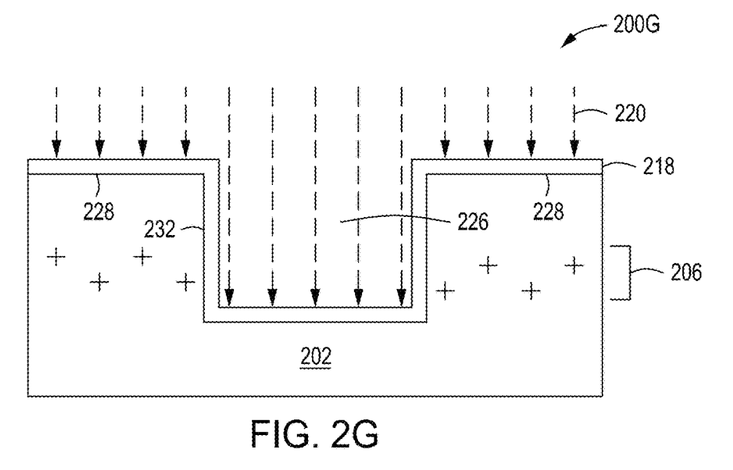
FIG. 2G depicts a treatment of a silicon dioxide layer in accordance with some embodiments of the present principles.

In block 116, an interface treatment 220 is performed on the silicon dioxide layer 218 as depicted in a view 200G of FIG. 2G. In some embodiments, the interface treatment 220 may include a high temperature or oxygen/nitrogen radical treatment to a desired thickness of silicon dioxide layer 218. In some embodiments, the deposition of the silicon dioxide layer 218 using ALD along with the high temperature or oxygen/nitrogen radical treatment may be optionally repeated 122 until a desired thickness of silicon dioxide is reached. In some embodiments, the interface treatment 220 may include a high temperature or oxygen/nitrogen radical treatment plus other conventional oxide deposition processes until a desired thickness is obtained. In some embodiments, other conventional oxide depositions may be performed on the silicon dioxide layer 218 prior to a high temperature or oxygen radical treatment to obtain a desired thickness. In some embodiments, the interface treatment 220 may include a high temperature or oxygen/nitrogen radical treatment plus other conventional oxide deposition processes plus a high temperature or oxygen radical treatment to a desired thickness. Nitrogen-based treatments form silicon oxynitride out of the silicon dioxide forming a dielectric with a higher k value than silicon dioxide and with a greater thickness than silicon dioxide, allowing an improved electric field when voltage is applied to the SiC-based gate. The nitrogen-based treatments enable an equivalent effect of the equivalent oxide thickness (EOT) at a higher thickness which is easier to process.

Figure 2H:
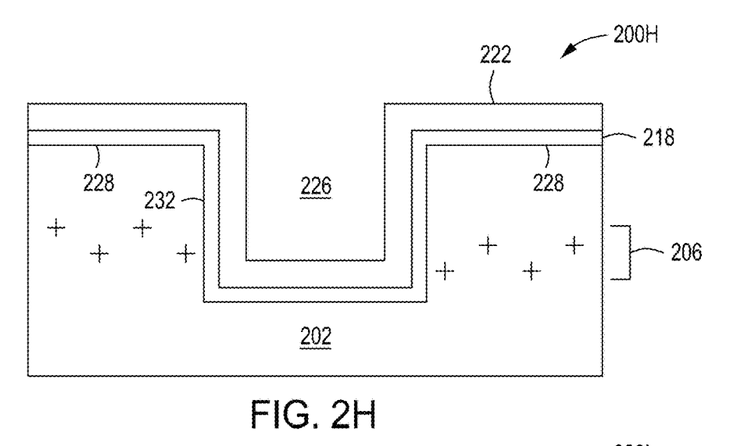
FIG. 2H depicts a gate oxide layer deposited on a trench structure in silicon carbide layer in accordance with some embodiments of the present principles.
Figure 2I:
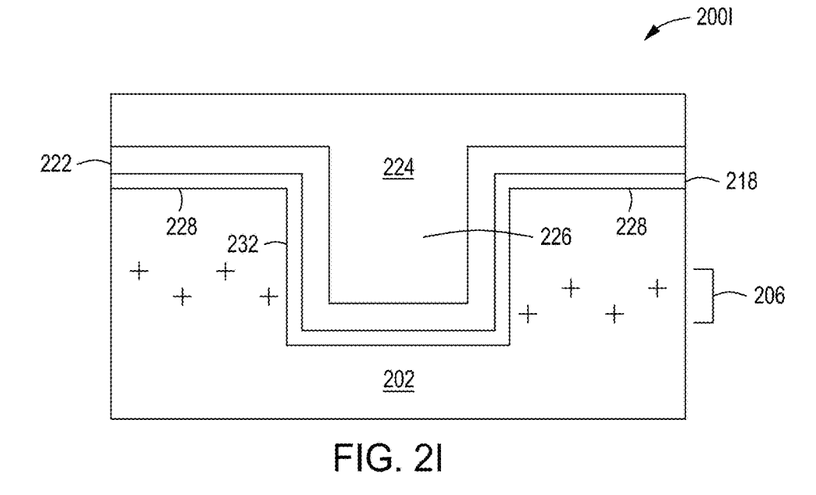
FIG. 2I depicts a gate material layer deposited on a trench structure in silicon carbide layer in accordance with some embodiments of the present principles.

In block 118, a gate oxide layer 222 is conformally deposited on the silicon dioxide layer 218 as depicted in a view 200H of FIG. 2H. The gate oxide layer 222 is formed with a higher quality silicon dioxide material than the silicon dioxide layer 218. The higher quality silicon dioxide material functions as the gate dielectric material. In some embodiments, the gate oxide layer 222 is a silicon dioxide material that is deposited by a high temperature oxide (HTO) process or by a furnace process using an oxidizing gas environment. Reactive oxygen has a higher affinity to silicon than to carbon. Silicon may be pulled from the silicon dioxide layer 218 by the deposition process of the gate oxide layer 222. In traditional processes, the silicon is pulled from the silicon carbide layer 202 causing carbon clusters to form which reduces the charge mobility. By forming the silicon dioxide layer 218 as a liner between the silicon carbide layer 202 and the gate oxide layer 222, silicon is pulled from the silicon dioxide layer 218 and not from the silicon carbide layer 202, dramatically reducing carbon clusters at the silicon carbide interface (as the chemical bonds are not rearranged at the surface and stoichiometry of the silicon carbide is maintained). In block 120, a gate material 224 is deposited on the gate oxide layer 222 as depicted in a view 200I of FIG. 2I. The gate material 224 generally fills the trench structure 226. In other processes (not shown), a chemical mechanical polishing (CMP) process may be performed to remove the silicon dioxide layer 218, the gate oxide layer 222, and the gate material 224 from the field surface 228 of the silicon carbide layer 202. Additional deposition, patterning, and removal processes performed to complete the gate are not described herein as the processes are conventional to one skilled in the art.

Figure 3:
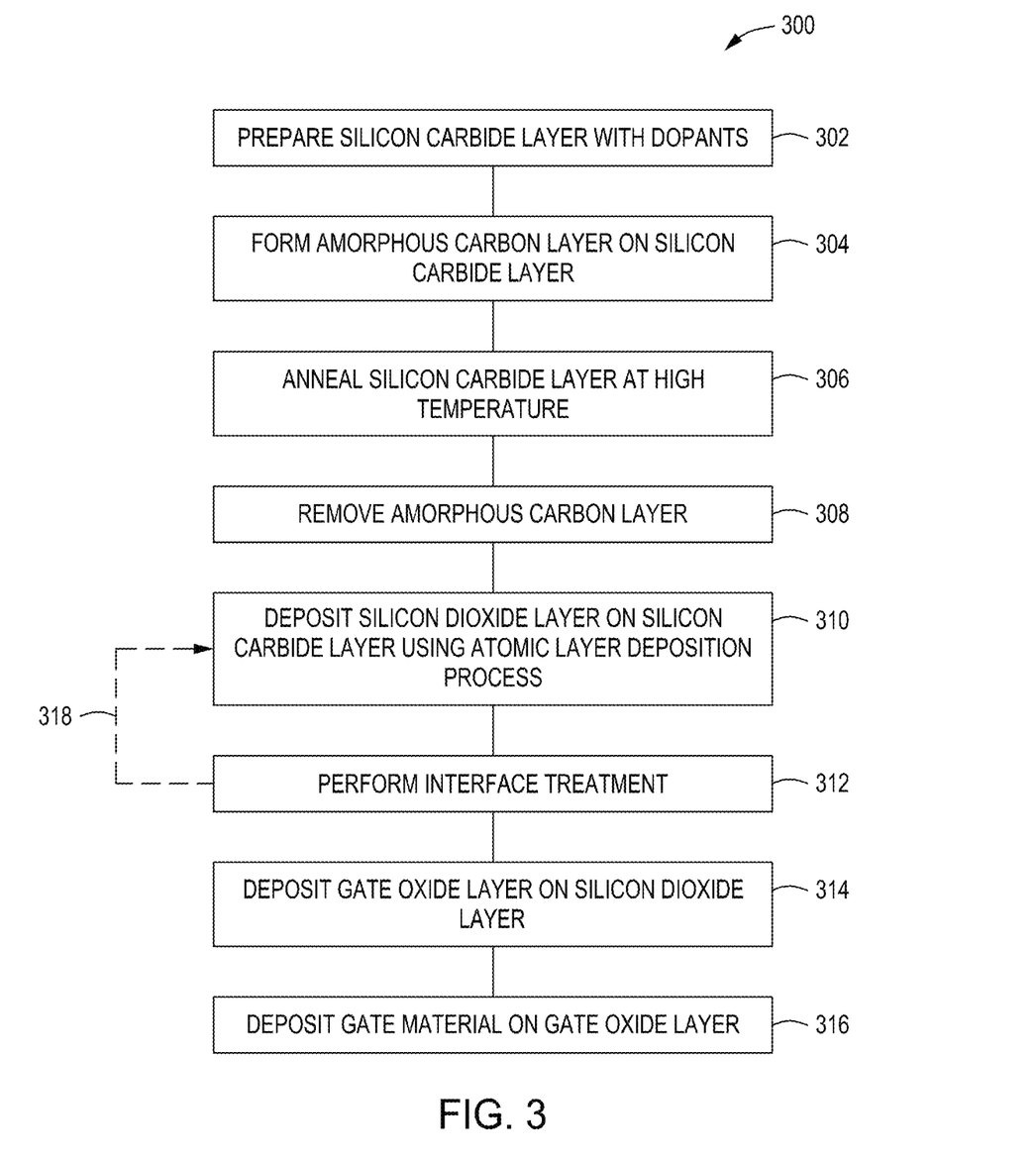
FIG. 3 is a method of forming a planar gate structure on a silicon carbide layer on a substrate in accordance with some embodiments of the present principles.

The techniques of the present principles are not limited to vertical trench gate structures and the like and may be performed to form planar gate structures. FIG. 3 is a method 300 of forming a planar gate structure in a silicon carbide layer on a substrate in accordance with some embodiments. FIGS. 4A-4F may be referenced during the method 300 discussion. The discussion of method 300 is summarized in comparison to the above discussion of the vertical structure methods for the sake of brevity and is not meant to be limiting for planar structures. Benefits and advantages discussed for the vertical structure processes are also applicable to planar structure processes where process techniques overlap.

Figure 4A:
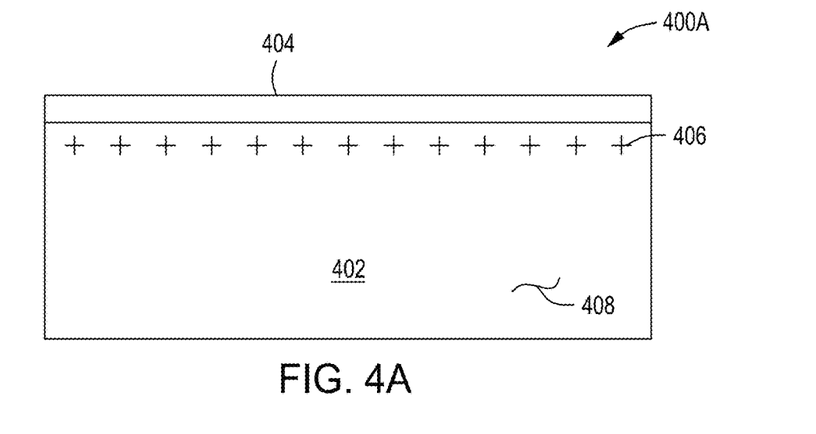
FIG. 4A depicts a cross-sectional view of an amorphous carbon layer on a silicon carbide layer in accordance with some embodiments of the present principles.

In block 302, a substrate with a silicon carbide layer 402 has been prepared previously (deposition/formation of silicon carbide layer 402 and doping, etc.) and may contain dopants 406 diffused into the silicon carbide layer 402 according to a specific gate structure type (P-type/N-type) as depicted in a view 400A of FIG. 4A. The silicon carbide layer 402 may also contain defects 408 such as basal plane dislocations and other types of defects that form during deposition of the silicon carbide layer 402. In block 304, an amorphous carbon layer 404 is formed on the silicon carbide layer 402 as depicted in a view 400A of FIG. 4A. The silicon carbide layer 402 functions as a capping layer for a subsequent annealing process. The capping layer prevents sublimation of silicon from the silicon carbide layer 402 under anneal high temperatures.

Figure 4B:
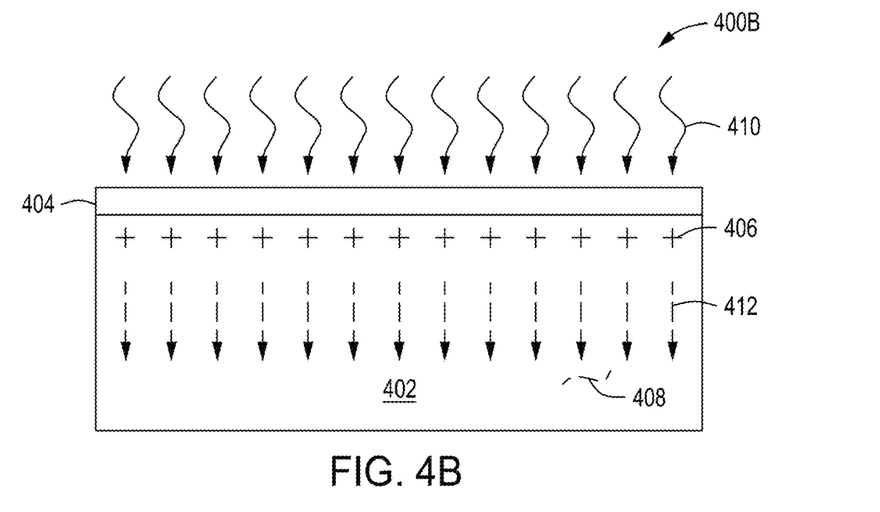
FIG. 4B depicts a cross-sectional view of a silicon carbide layer being annealed in accordance with some embodiments of the present principles.

In block 306, the silicon carbide layer 402 is annealed 410 at high temperatures as depicted in a view 400B of FIG. 4B. In some embodiments, the annealing temperature may be greater than approximately 1800 degrees Celsius. In some embodiments, the annealing temperature may be greater than approximately 2000 degrees Celsius. The amorphous carbon layer 404 can withstand extremely high temperatures and prevents sublimation of the silicon during the annealing process. The extremely high temperatures of the annealing process 412 drive the dopants 406 further into the silicon carbide layer 402 and may also eliminate or reduce the defects 408 (dashed line) in the silicon carbide layer 402. The annealing process may be performed on many substrates at a time in a batch process in a furnace and the like.

In block 308, the amorphous carbon layer is removed by ashing processes and the like to expose the underlying silicon carbide layer 402. In block 310, a silicon dioxide layer 418 is deposited on the silicon carbide layer 402 using an ALD process as depicted in a view 400O of FIG. 4C. In some embodiments, the silicon dioxide layer 418 is deposited using low temperatures of approximately 100 degrees Celsius to approximately 600 degrees Celsius. The low temperatures allow for formation of the silicon dioxide layer 418 on the silicon carbide layer 402 without disrupting the interface 432 between the silicon dioxide layer 418 and the silicon carbide layer 402, preserving the silicon and carbon atomic structures in the silicon carbide layer 402 to increase charge mobility. The low temperature silicon dioxide deposition process prevents carbon clustering at the interface 432 to substantially increase charge mobility.

Figure 4C:
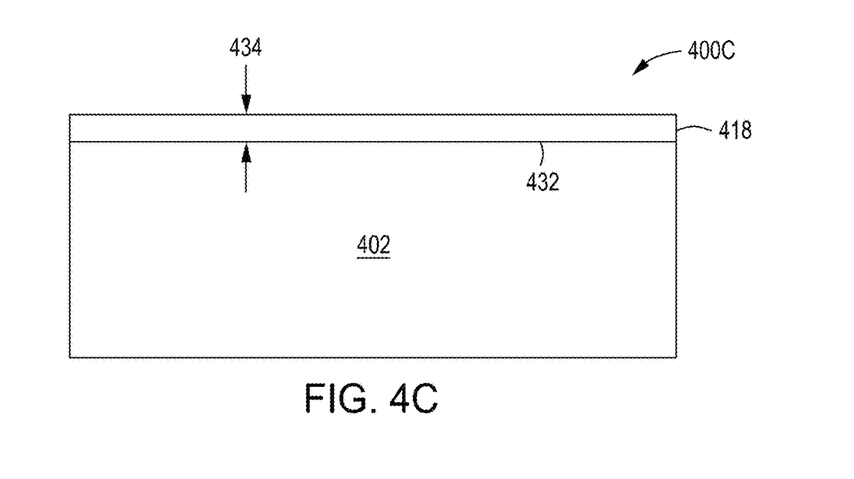
FIG. 4C depicts a silicon dioxide layer deposited on a silicon carbide layer in accordance with some embodiments of the present principles.

In some embodiments, the silicon dioxide deposition process is performed in an ALD chamber using gas precursors, such as but not limited to, $SiCl_4$, $NH_3$ and $H_2O$, bis(t-butylamino) silane (BTAS), bis(diethylamino) silane (BDEAS), and/or trisilylamine (TSA), diisopropylamino silane (DIPAS), etc. In some embodiments, the silicon dioxide layer 418 may be deposited to a thickness 434 of approximately 5 nm to approximately 10 nm. Pressure during the deposition process may be in the millitorr range to the torr range. The quality of the low-temperature silicon dioxide deposition is generally too low to function as the gate dielectric of a gate. The silicon dioxide layer 418 functions as an interface between the silicon carbide layer 402 and a subsequently deposited gate oxide layer to preserve the silicon-carbon structures in the silicon carbide layer 402.

Figure 4D:
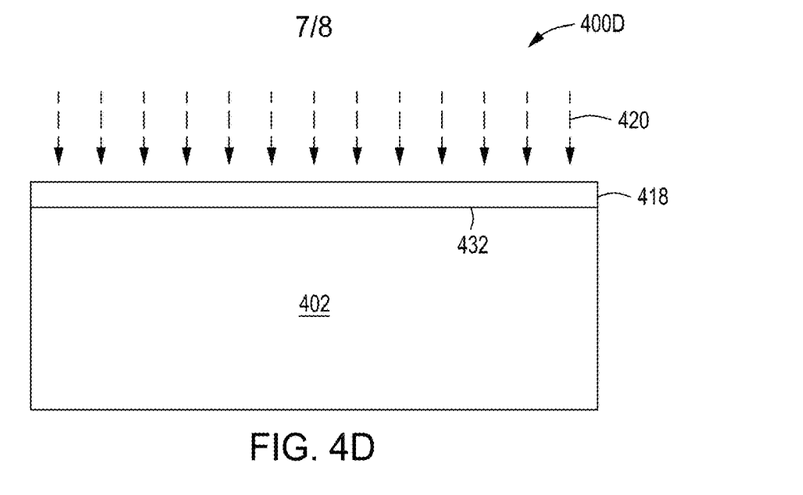
FIG. 4D depicts a treatment of a silicon dioxide layer in accordance with some embodiments of the present principles.

In block 312, an interface treatment 420 is performed on the silicon dioxide layer 418 as depicted in a view 400D of FIG. 4D. In some embodiments, the interface treatment 420 may include a high temperature or oxygen/nitrogen radical treatment to a desired thickness of silicon dioxide layer 418. In some embodiments, the deposition of the silicon dioxide layer 418 using ALD along with the high temperature or oxygen/nitrogen radical treatment may be optionally repeated 318 until a desired thickness of silicon dioxide is reached. In some embodiments, the interface treatment 420 may include a high temperature or oxygen/nitrogen radical treatment plus other conventional oxide deposition processes until a desired thickness is obtained. In some embodiments, other conventional oxide depositions may be performed on the silicon dioxide layer 418 prior to a high temperature or oxygen radical treatment to obtain a desired thickness. In some embodiments, the interface treatment 420 may include a high temperature or oxygen/nitrogen radical treatment plus other conventional oxide deposition processes followed by a high temperature or oxygen radical treatment to a desired thickness.

Figure 4E:
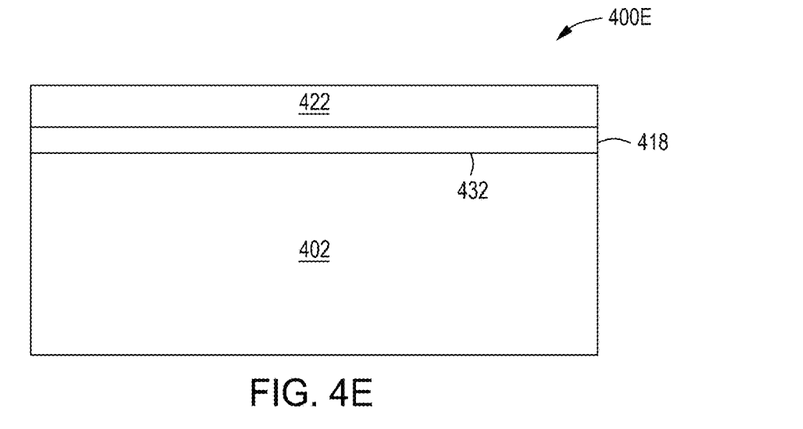
FIG. 4E depicts a gate oxide layer deposited on a silicon carbide layer in accordance with some embodiments of the present principles.
Figure 4F:
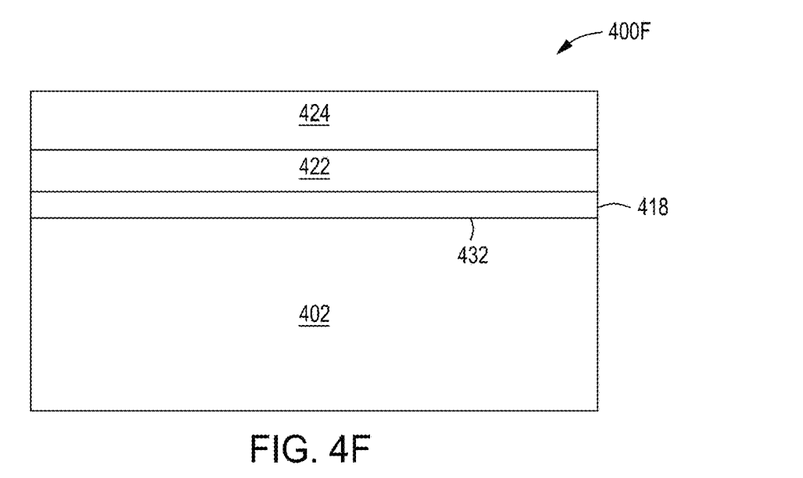
FIG. 4F depicts a gate material layer deposited on a gate oxide layer in accordance with some embodiments of the present principles.

In block 314, a gate oxide layer 422 is deposited on the silicon dioxide layer 418 as depicted in a view 400E of FIG. 4E. The gate oxide layer 422 is formed from a higher quality silicon dioxide material than the silicon dioxide layer 418 and functions as a gate dielectric material. In some embodiments, the gate oxide layer 422 is a silicon dioxide material that is deposited by a high temperature oxide (HTO) process (approximately 700 degrees Celsius to approximately 900 degrees Celsius, single substrate process) or by a furnace process (approximately 700 degrees Celsius to approximately 1000 degrees Celsius, batch substrate process). In block 316, a gate material 424 is deposited on the gate oxide layer 422 as depicted in a view 400F of FIG. 4F. Additional processes (not shown) including deposition, patterning, and removal processes may be performed to complete the gate and are not described herein as the processes are conventional to one skilled in the art.

Figure 5:
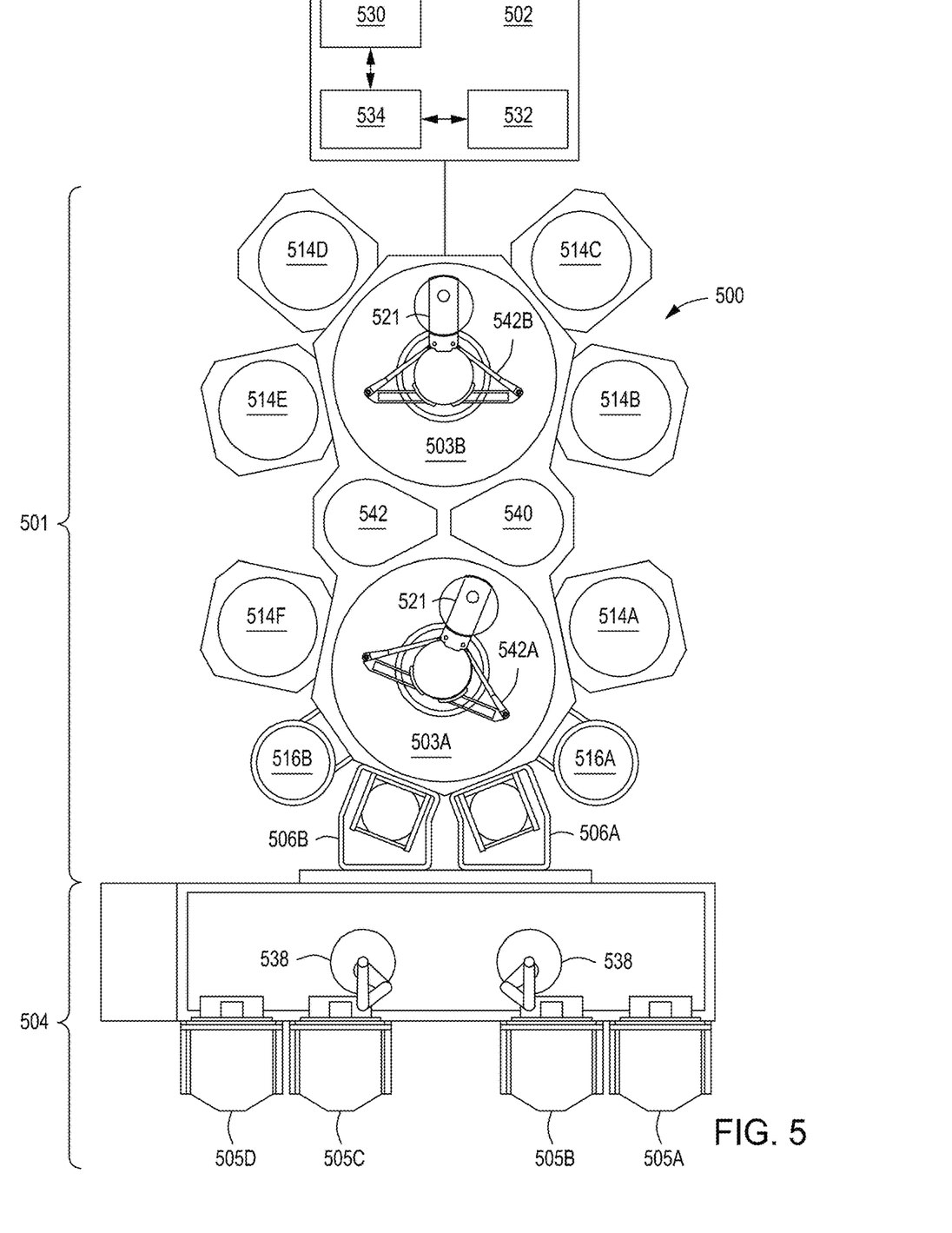
FIG. 5 depicts an integrated tool in accordance with some embodiments of the present principles.

The methods described herein may be performed in individual process chambers that may be provided in a standalone configuration or as part of a cluster tool, for example, an integrated tool 500 (i.e., cluster tool) described below with respect to FIG. 5. The advantage of using an integrated tool 500 is that there is no vacuum break and, therefore, no requirement to degas and pre-clean a substrate before deposition in an ALD chamber. For example, in some embodiments the inventive methods discussed above may advantageously be performed in an integrated tool such that there are limited or no vacuum breaks between processes, limiting or preventing contamination of the substrate. The integrated tool 500 includes a vacuum-tight processing platform 501, a factory interface 504, and a system controller 502. The processing platform 501 comprises multiple processing chambers, such as 514A, 513B, 514C, 514D, 514E, and 514F operatively coupled to a vacuum substrate transfer chamber (transfer chambers 503A, 503B). The factory interface 504 is operatively coupled to the transfer chamber 503A by one or more load lock chambers (two load lock chambers, such as 506A and 506B shown in FIG. 5).

In some embodiments, the factory interface 504 comprises at least one docking station 507, at least one factory interface robot 538 to facilitate the transfer of the semiconductor substrates. The docking station 507 is configured to accept one or more front opening unified pod (FOUP). Four FOUPS, such as 505A, 505B, 505C, and 505D are shown in the embodiment of FIG. 5. The factory interface robot 538 is configured to transfer the substrates from the factory interface 504 to the processing platform 501 through the load lock chambers, such as 506A and 506B. Each of the load lock chambers 506A and 506B have a first port coupled to the factory interface 504 and a second port coupled to the transfer chamber 503A. The load lock chamber 506A and 506B are coupled to a pressure control system (not shown) which pumps down and vents the load lock chambers 506A and 506B to facilitate passing the substrates between the vacuum environment of the transfer chamber 503A and the substantially ambient (e.g., atmospheric) environment of the factory interface 504. The transfer chambers 503A, 503B have vacuum robots 542A, 542B disposed in the respective transfer chambers 503A, 503B. The vacuum robot 542A is capable of transferring substrates 521 between the load lock chamber 506A, 506B, the processing chambers 514A and 514F and a cooldown station 540 or a pre-clean station 542. The vacuum robot 542B is capable of transferring substrates 521 between the cooldown station 540 or pre-clean station 542 and the processing chambers 514B, 514C, 514D, and 514E.

In some embodiments, the processing chambers 514A, 514B, 514C, 514D, 514E, and 514F are coupled to the transfer chambers 503A, 503B. The processing chambers 514A, 514B, 514C, 514D, 514E, and 514F may comprise, for example, an ALD process chamber, a physical vapor deposition (PVD) process chamber, chemical vapor deposition (CVD) chambers, annealing chambers, furnaces, or the like. The chambers may include any chambers suitable to perform all or portions of the methods described herein, as discussed above, such as a dry oxide removal chamber or pre-clean chamber and an epitaxial growth chamber along with etching and deposition chambers. In some embodiments, one or more optional service chambers (shown as 516A and 516B) may be coupled to the transfer chamber 503A. The service chambers 516A and 516B may be configured to perform other substrate processes, such as degassing, orientation, substrate metrology, cool down and the like.

The system controller 502 controls the operation of the tool 500 using a direct control of the process chambers 514A, 514B, 514C, 514D, 514E, and 514F or alternatively, by controlling the computers (or controllers) associated with the process chambers 514A, 514B, 514C, 514D, 514E, and 514F and the tool 500. In operation, the system controller 502 enables data collection and feedback from the respective chambers and systems to optimize performance of the tool 500. The system controller 502 generally includes a Central Processing Unit (CPU) 530, a memory 534, and a support circuit 532. The CPU 530 may be any form of a general-purpose computer processor that can be used in an industrial setting. The support circuit 532 is conventionally coupled to the CPU 530 and may comprise a cache, clock circuits, input/output subsystems, power supplies, and the like. Software routines, such as a method as described above may be stored in the memory 534 and, when executed by the CPU 530, transform the CPU 530 into a specific purpose computer (system controller) 502. The software routines may also be stored and/or executed by a second controller (not shown) that is located remotely from the tool 500.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a gate structure on a substrate, comprising:
   depositing an amorphous carbon layer on a silicon carbide layer of the gate structure on the substrate to form a capping layer on the silicon carbide layer;
   annealing the silicon carbide layer at a temperature of greater than approximately 1800 degrees Celsius;
   forming a hard mask on the silicon carbide layer by patterning the amorphous carbon layer;
   etching a trench structure of the gate structure into the silicon carbide layer using the hard mask;
   removing the hard mask to expose the silicon carbide layer;
   depositing a silicon dioxide layer of the gate structure on the silicon carbide layer using an atomic layer deposition process;
   performing at least one interface treatment on the silicon dioxide layer;
   depositing a gate oxide layer of the gate structure on the silicon dioxide layer; and
   depositing a gate material of the gate structure on the gate oxide layer.

2. The method of claim 1, further comprising:
   annealing the silicon carbide layer at a temperature of greater than approximately 2000 degrees Celsius.

3. The method of claim 1, further comprising:
   etching the trench structure into the silicon carbide layer using a selective etch process with a higher etch rate of silicon carbide than amorphous carbon.

4. The method of claim 1, further comprising:
   annealing the silicon carbide layer after depositing the amorphous carbon layer to diffuse dopants into the silicon carbide layer.

5. The method of claim 1, further comprising:
   annealing the silicon carbide layer after depositing the amorphous carbon layer to remove defects in the silicon carbide layer.

6. The method of claim 1, further comprising:
   patterning the amorphous carbon layer by spin coating a photoresist layer on the amorphous carbon layer, exposing the photoresist layer to a light source, and removing areas of the amorphous carbon layer where at least one trench structure is to be formed.

7. The method of claim 1, further comprising:
   depositing the silicon dioxide layer on the silicon carbide layer using the atomic layer deposition process at a temperature of approximately 100 degrees Celsius to approximately 600 degrees Celsius.

8. The method of claim 1, further comprising:
   depositing the silicon dioxide layer on the silicon carbide layer using the atomic layer deposition process to a thickness of approximately 1 nm to approximately 100 nm.

9. The method of claim 1, further comprising:
   depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino) silane (BDEAS), trisilylamine (TSA), or diisopropylamino silane (DIPAS).

10. The method of claim 1, further comprising:
    performing at least one interface treatment on the silicon dioxide layer including high temperature, oxygen/nitrogen radical treatment, or an additional oxide deposition.

11. A method of forming a gate structure on a substrate, comprising:
    depositing an amorphous carbon layer on a silicon carbide layer of the gate structure on the substrate to form a capping layer on the silicon carbide layer;
    annealing the silicon carbide layer at a temperature of greater than approximately 1800 degrees Celsius;
    forming a hard mask on the silicon carbide layer by patterning the amorphous carbon layer with a photoresist layer;
    selectively etching a trench structure of the gate structure into the silicon carbide layer using the hard mask with an etch process having a higher etch rate of silicon carbide over amorphous carbon;
    removing the hard mask to expose the silicon carbide layer;
    depositing a silicon dioxide layer of the gate structure on the silicon carbide layer using an atomic layer deposition process at a process temperature of approximately 100 degrees Celsius to approximately 600 degrees Celsius;
    performing at least one interface treatment on the silicon dioxide layer including high temperature, oxygen/nitrogen radical treatment, or an additional oxide deposition;
    depositing a gate oxide layer of the gate structure on the silicon dioxide layer; and
    depositing a gate material of the gate structure on the gate oxide layer.

12. The method of claim 11, further comprising:
    annealing the silicon carbide layer at a temperature of greater than approximately 2000 degrees Celsius.

13. The method of claim 11, further comprising:
    annealing the silicon carbide layer after depositing the amorphous carbon layer to diffuse dopants into the silicon carbide layer.

14. The method of claim 11, further comprising:
annealing the silicon carbide layer after depositing the amorphous carbon layer to remove defects in the silicon carbide layer.

15. The method of claim 11, further comprising:
depositing the silicon dioxide layer on the silicon carbide layer using the atomic layer deposition process to a thickness of approximately 1 nm to approximately 100 nm.

16. The method of claim 11, further comprising:
depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino) silane (BDEAS), trisilylamine (TSA), or diisopropylamino silane (DIPAS).

17. A non-transitory, computer readable medium having instructions stored thereon that, when executed, cause a method for forming a gate structure on a substrate to be performed, the method comprising:
depositing an amorphous carbon layer on a silicon carbide layer of the gate structure on the substrate to form a capping layer on the silicon carbide layer;
annealing the silicon carbide layer at a temperature of greater than approximately 1800 degrees Celsius;
forming a hard mask on the silicon carbide layer by patterning the amorphous carbon layer;
etching a trench structure of the gate structure into the silicon carbide layer using the hard mask;
removing the hard mask to expose the silicon carbide layer;
depositing a silicon dioxide layer of the gate structure on the silicon carbide layer using an atomic layer deposition process;
performing at least one interface treatment on the silicon dioxide layer;
depositing a gate oxide layer of the gate structure on the silicon dioxide layer; and
depositing a gate material of the gate structure on the gate oxide layer.

18. The non-transitory, computer readable medium of claim 17, further comprising:
annealing the silicon carbide layer at a temperature of greater than approximately 2000 degrees Celsius.

19. The non-transitory, computer readable medium of claim 17, further comprising:
depositing the silicon dioxide layer on the silicon carbide layer using the atomic layer deposition process at a temperature of approximately 100 degrees Celsius to approximately 600 degrees Celsius; or
depositing the silicon dioxide layer on the silicon carbide layer using the atomic layer deposition process to a thickness of approximately 1 nm to approximately 100 nm.

20. The non-transitory, computer readable medium of claim 17, further comprising:
depositing the silicon dioxide layer on the silicon carbide layer using the atomic layer deposition process with a gas precursor gas of $SiCl_4$, $NH_3$ and $H_2O$, bis(t-butylamino) silane (BTBAS), bis(diethylamino)silane (BDEAS), trisilylamine (TSA), or diisopropylamino silane (DIPAS); or
performing at least one interface treatment on the silicon dioxide layer including high temperature, oxygen/nitrogen radical treatment, or an additional oxide deposition.

* * * * *